United States Patent [19]

Bayruns et al.

[11] Patent Number: 5,748,049

[45] Date of Patent: May 5, 1998

[54] MULTI-FREQUENCY LOCAL OSCILLATORS

[75] Inventors: John Thomas Bayruns, Middlesex; Raymond Mitchell Waugh, Phillipsburg; Phillip W. Wallace, Bernardsville; Robert J. Bayruns, Middlesex; Thomas D. DeNigris, Livingston, all of N.J.

[73] Assignee: Anadigics, Inc., Warren, N.J.

[21] Appl. No.: 344,753

[22] Filed: Nov. 23, 1994

[51] Int. Cl.$^6$ ............... H03B 5/00; H04B 1/26
[52] U.S. Cl. ............ 331/49; 331/116 FE; 331/117 FE; 331/117 D; 331/179; 455/255; 455/318
[58] Field of Search ............... 331/49, 116 R, 331/116 FE, 117 D, 179, 117 FE; 455/255, 257, 258, 318

[56] References Cited

U.S. PATENT DOCUMENTS

| | | | |
|---|---|---|---|
| 3,296,550 | 1/1967 | Hukami et al. | 331/49 |
| 4,021,742 | 5/1977 | Machida | 329/50 |
| 4,048,619 | 9/1977 | Forman, Jr. et al. | 370/71 |
| 4,484,156 | 11/1984 | Khanna et al. | 331/96 |
| 4,590,433 | 5/1986 | Kusakabe | 329/50 |
| 4,600,898 | 7/1986 | Santos et al. | 331/116 FE |
| 4,649,354 | 3/1987 | Khanna | 331/179 |
| 4,740,759 | 4/1988 | Kasperkovitz et al. | 329/50 |
| 4,777,449 | 10/1988 | O'Connor | 329/50 |
| 5,128,626 | 7/1992 | Iwasaki | 329/307 |
| 5,130,675 | 7/1992 | Sugawara | 331/117 FE |
| 5,200,977 | 4/1993 | Ohnishi et al. | 375/15 |
| 5,230,097 | 7/1993 | Currie et al. | 455/226.1 |
| 5,280,643 | 1/1994 | Ishii | 455/254 |
| 5,306,969 | 4/1994 | Kimura | 307/529 |
| 5,323,064 | 6/1994 | Bacon et al. | 307/271 |
| 5,345,188 | 9/1994 | Owen | 329/323 |

OTHER PUBLICATIONS

Howe, Jr. et al., "Programmable System Clock Oscillator", IBM Technical Disclosure Bulletin, vol. 20, No. 6, Nov. 1977, pp. 2185–2186, (331-179).

Primary Examiner—Siegfried H. Grimm
Attorney, Agent, or Firm—Pennie & Edmonds LLP

[57] ABSTRACT

A multiple-frequency local oscillator for providing an LO signal at one of a multiple of predetermined resonant frequencies associated with a number of resonators is disclosed. It includes a number of LO input ports for coupling to a plurality of resonators, respectively, each resonator having a predetermined resonant frequency; the local oscillator is controlled to selectively provide at its LO output port an output LO signal at any one of the resonant frequencies.

42 Claims, 11 Drawing Sheets

5,748,049

MULTI-FREQUENCY LOCAL OSCILLATORS

FIELD OF THE INVENTION

The present invention relates to local oscillators and more particularly, local oscillators for selectively providing oscillation signal at one of a multiple of predetermined frequencies.

BACKGROUND OF THE INVENTION

Frequency downconverters are commonly used in cable TV ("CATV") and direct broadcast satellite ("DBS") systems for converting a received radio-frequency ("RF") signal into an intermediate frequency ("IF") signal.

A frequency downconverter system generally includes three basic functional blocks: a low noise RF amplifier ("LNA") for amplifying a received RF signal, a local oscillator ("LO") for providing an LO signal, and a mixer for combining the amplified RF signal and the LO signal to generate an IF signal.

In the currently used European DBS systems, the input RF signal frequency is between 10.7 and 11.8 GHz, which is downconverted to an IF signal frequency between 950 and 2050 MHz; the LO signal frequency used is about 9.7 GHz.

To expand the number of channels that can be provided by the DBS systems, it has been proposed to increase the input RF signal frequency spectrum from 10.7–11.8 GHz to 10.7–12.75 GHz to cover two frequency bands, 10.7–11.7 GHz and 11.7–12.75 GHz. The IF signals corresponding to the two RF bands will have frequencies of 950–1950 MHz and 1100–2150 MHz, respectively. The LO frequencies required for the two RF bands will be 9.75 GHz and 10.6 GHz, respectively.

One approach for providing a DBS reception system capable of operating at both RF bands is illustrated in FIG. 1. In this approach, a downconverter system 100 consists of an antenna 105 for receiving an RF signal from a satellite and an LNA 110 connected to the antenna for amplifying the received RF signal. The amplified RF signal is then divided into two routes, one to a 10.7–11.7 GHz band pass filter 115 followed by a downconverter 120 operating with an LO signal of 9.75 GHz, and the other to an 11.7–12.75 GHz band pass filter 125 followed by another downconverter 130 operating with an LO signal of 10.6 GHz. At the output of downconverter 120, an IF signal between 950–1950 MHz is provided, whereas at the output of downconverter 130, an IF signal between 1000–2100 MHz is provided. Consequently, this system covers both RF frequency bands, i.e. 10.7–11.7 GHz and 11.7–12.75 GHz.

One major drawback associated with the above-described system is that it requires two independent downconverters, thus making it more expensive than the currently used single downconverter system operating at a single LO frequency of 9.7 GHz. A single downconverter capable of operating at both RF bands is desired, which requires a local oscillator capable of selectively providing an LO signal at either 9.75 GHz or 10.6 GHz.

It is therefore an object of the present invention to provide an LO which can selectively provide an LO signal at one of a multiple of predetermined frequencies;

it is another object of the present invention to provide means for controlling the LO to select one of the predetermined multiple LO frequencies;

it is further an object of the present invention to provide an LO for selectively providing an LO signal at either 9.75 GHz or 10.6 GHz; and it is yet another object of the present invention to provide a frequency converting device including a multiple-frequency local oscillator.

SUMMARY OF THE INVENTION

Those and other objects and advantages are achieved in the present invention, which provides a multiple-frequency local oscillator and a frequency converting device utilizing the multiple-frequency local oscillator.

The multi-frequency local oscillator of the present invention includes a number of input ports coupled to a number of external resonators, respectively, each having a predetermined resonant frequency, an LO output port, and means for controlling the oscillator to selectively provide an LO output signal at any one of the resonant frequencies at the LO output port.

In one embodiment, a multiple-frequency LO includes a plurality of oscillator circuits, each having its input terminal connected to an LO input ports for coupling to a resonator; the output terminals of the oscillation circuits are connected together to an LO output port. The multi-frequency local oscillator further includes means for controlling the plurality of oscillator circuits such that only one of them is selected to operate while the other ones are prevented from operation. Consequently, by selecting the oscillator that is coupled to the resonator having the desired resonant frequency, this local oscillator provides at the LO output port an output LO signal at the desired frequency.

In a preferred embodiment, the multi-frequency local oscillator is in the form of a GaAs monolithic integrated circuit and comprises two depletion mode GaAs FETs. The gate terminals of the GaAs FETs are connected to two LO input ports for coupling to two external dielectric resonators, respectively, having resonant frequencies of 9.75 GHz and 10.6 GHz. The source terminals of the two GaAs FETs are connected together and then coupled to the ground through a common source impedance circuit. The drain terminals of the GaAs FETs are coupled to a DC power supply through two inductors, respectively, and a common inductor. At the intersection of the two inductors and the common inductor, an output LO signal is provided.

When operating, the output LO frequency is selected by applying a ground or a positive potential to the FET gate terminal that is connected to the resonator having the desired resonant frequency so as to turn on the FET, while applying a negative potential to the gate terminal of the other FET to turn it off. As a result, the selected FET operates in conjunction with the resonator connected thereto to provide an LO signal at the resonant frequency of the resonator.

In another embodiment, a multiple-frequency local oscillator includes an oscillator circuit and a switching circuit. The oscillator circuit has an output node connected to an LO output port and an input node connected to an output node of the switch circuit. The switching circuit has a plurality of input nodes connected to a plurality LO input ports, respectively, for coupling to a plurality of external resonators.

When operating, the switching circuit is controlled such that it couples only one resonator to the oscillator circuit while it decouples all the other resonators from the oscillator circuit. As a result, the local oscillator provides an output LO signal at a frequency that is the resonant frequency of the one resonator coupled to the oscillator circuit. By selectively coupling the desired resonator to the oscillator circuit, this multi-frequency local oscillator provides an LO signal at any one of the resonant frequencies of the resonators.

In a preferred embodiment, this multi-frequency local oscillator is a GaAs monolithic IC which is defined by two functional circuit blocks, an oscillator circuit and a switching circuit. The former includes a depletion mode GaAs FET, the drain terminal of which is coupled to a DC power supply through a drain impedance load, and the source terminal of which is coupled to the ground potential via a source impedance. The intersection of the drain terminal and its impedance load is connected to an LO output port of this local oscillator.

The switching circuit is mainly composed of two depletion mode GaAs FETs, each having its drain terminal connected to the gate terminal of the FET in the oscillator circuit. The source terminals of the FETs are coupled to two external dielectric resonators, respectively; the resonators have respective resonant frequencies of 9.75 GHz and 10.6 GHz. By applying appropriate voltages to the gate terminals of the two FETs, respectively, so as to allow the desired resonator to couple to the oscillator circuit while to decouple the other resonator, the frequency of the output LO signal is thus selected to be the resonant frequency of the resonator coupled to the oscillator circuit.

The present invention is also directed to frequency conversion devices such as upconverters or downconverters utilizing the multi-frequency local oscillators of the present invention. specifically, a frequency conversion device of the present invention comprise two basic functional blocks, a mixer circuit coupled to a multi-frequency local oscillator. When operating, the mixer circuit receives an RF signal, combines it with an LO signal received from the multi-frequency local oscillator, and provides an output IF signal. The LO signal frequency is one of a multiple of frequencies and is selected to suit a particular input RF frequency range.

BRIEF DESCRIPTION OF THE DRAWINGS

These and other objects, features and advantages of the present invention will be more apparent from the following detailed description in conjunction with the appended drawings in which.

DETAILED DESCRIPTION

The present invention is directed to a multi-frequency local oscillator and to the application of the multi-frequency local oscillator to a frequency conversion device such as an upconverter or a downconverter.

Figure 1:
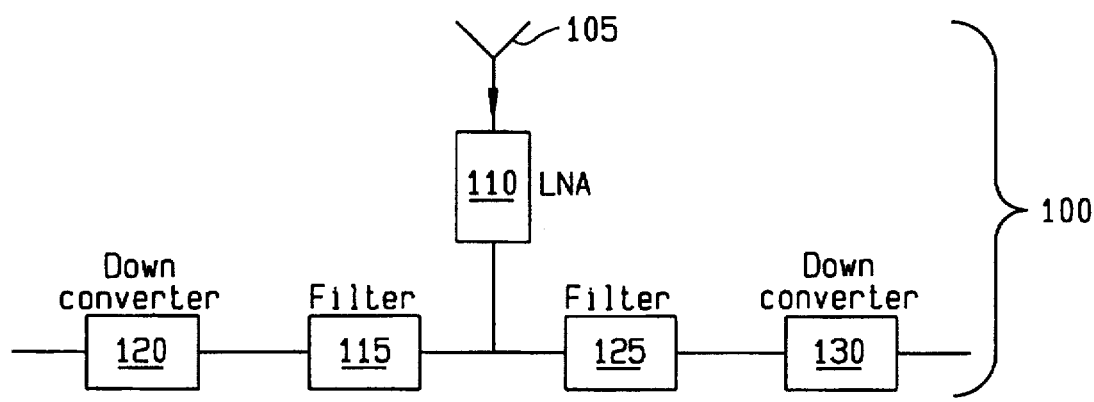
FIG. 1 illustrates a prior art frequency converting system.
Figure 2:
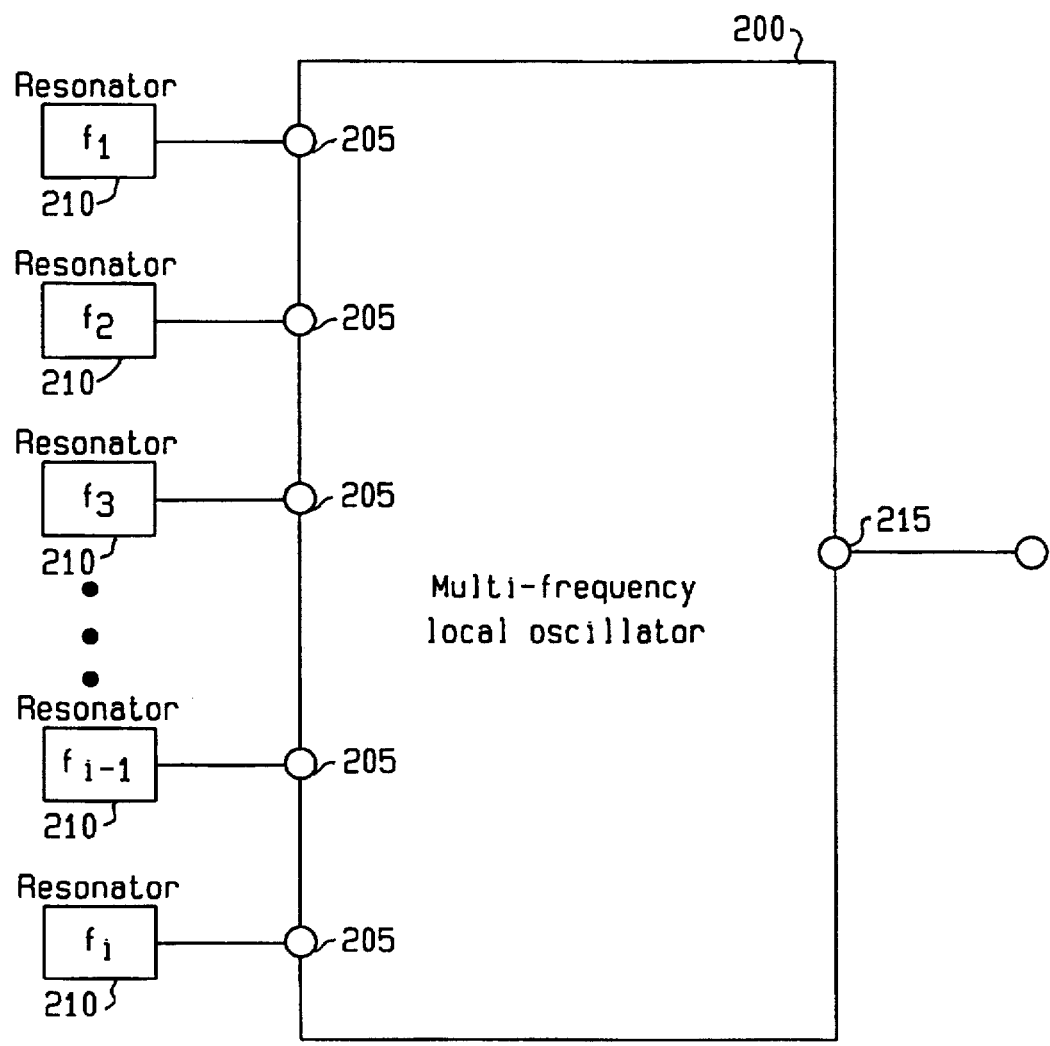
FIG. 2 depicts a multiple-frequency local oscillator of the present invention.

Referring to FIG. 2, a multiple-frequency LO 200 of the present invention has a number of input ports 205 for coupling to a number of external resonators 210, respectively, and an output port 215. Each of the external resonators has a distinct resonant frequency, $f_i$. Multi-frequency LO 200 operates with resonators 210 to selectively provide at output port 215 an output signal at any one of the resonant frequencies.

Figure 3:
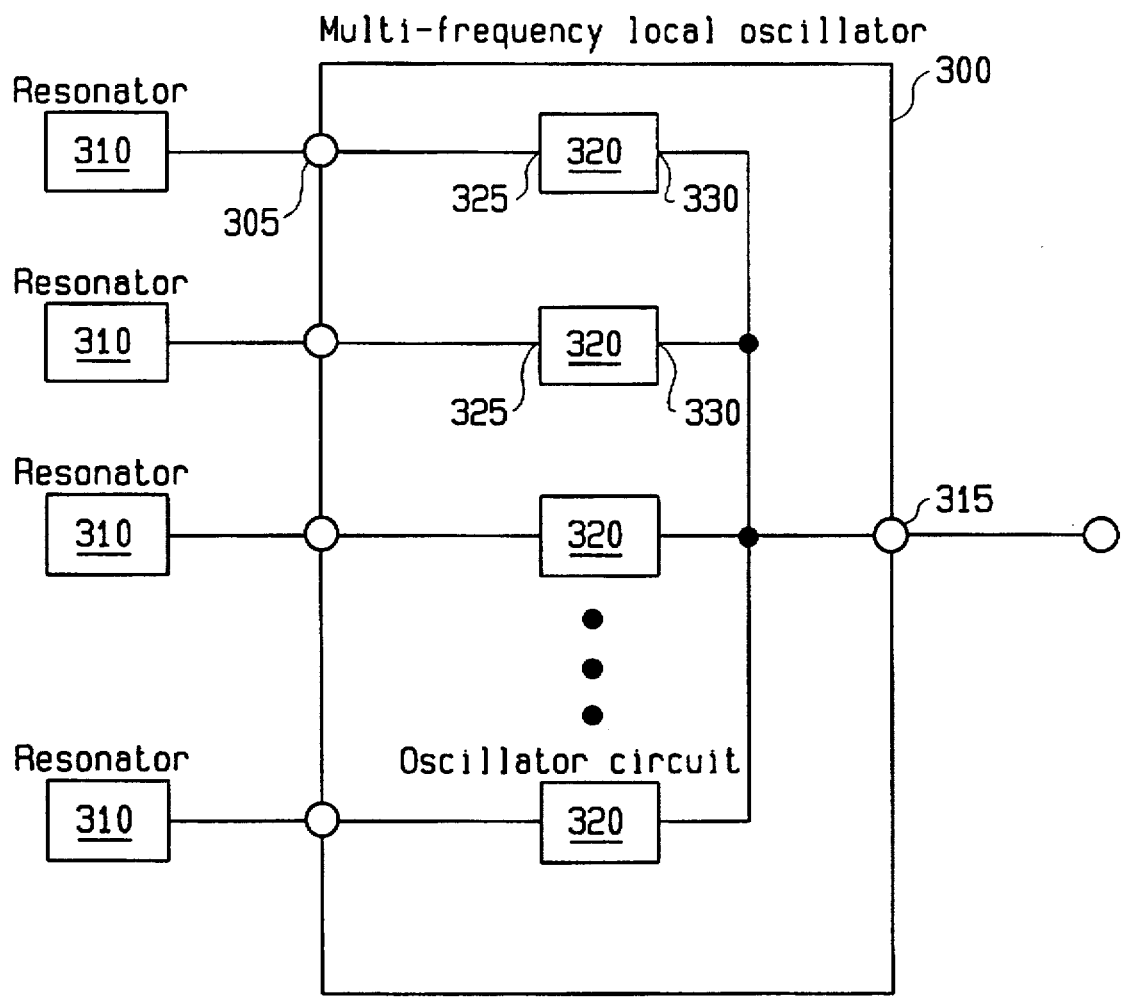
FIG. 3 depicts a first embodiment of the multiple-frequency local oscillator of the present invention.

In a first embodiment of the present invention, illustrated in FIG. 3, a multi-frequency local oscillator 300 includes a number of oscillator circuits 320. Each oscillator circuit 320 has an input terminal 325 connected to an LO input port 305 for coupling to a resonator 310, and an output terminal 330 connected to an LO output port 315. Each oscillator circuit is capable of operating in conjunction with the external resonator connected thereto to generate at output port 315 an LO signal at the resonator's resonant frequency.

The local oscillator further provides means for controlling oscillator circuits 320 such that only one of them is selected to operate while the others are prevented from operation. As a result, the operating one oscillator circuit operates in conjunction with the resonator connected thereto to provide at output port 315 an LO signal at the resonant frequency of the resonator.

Figure 4A:
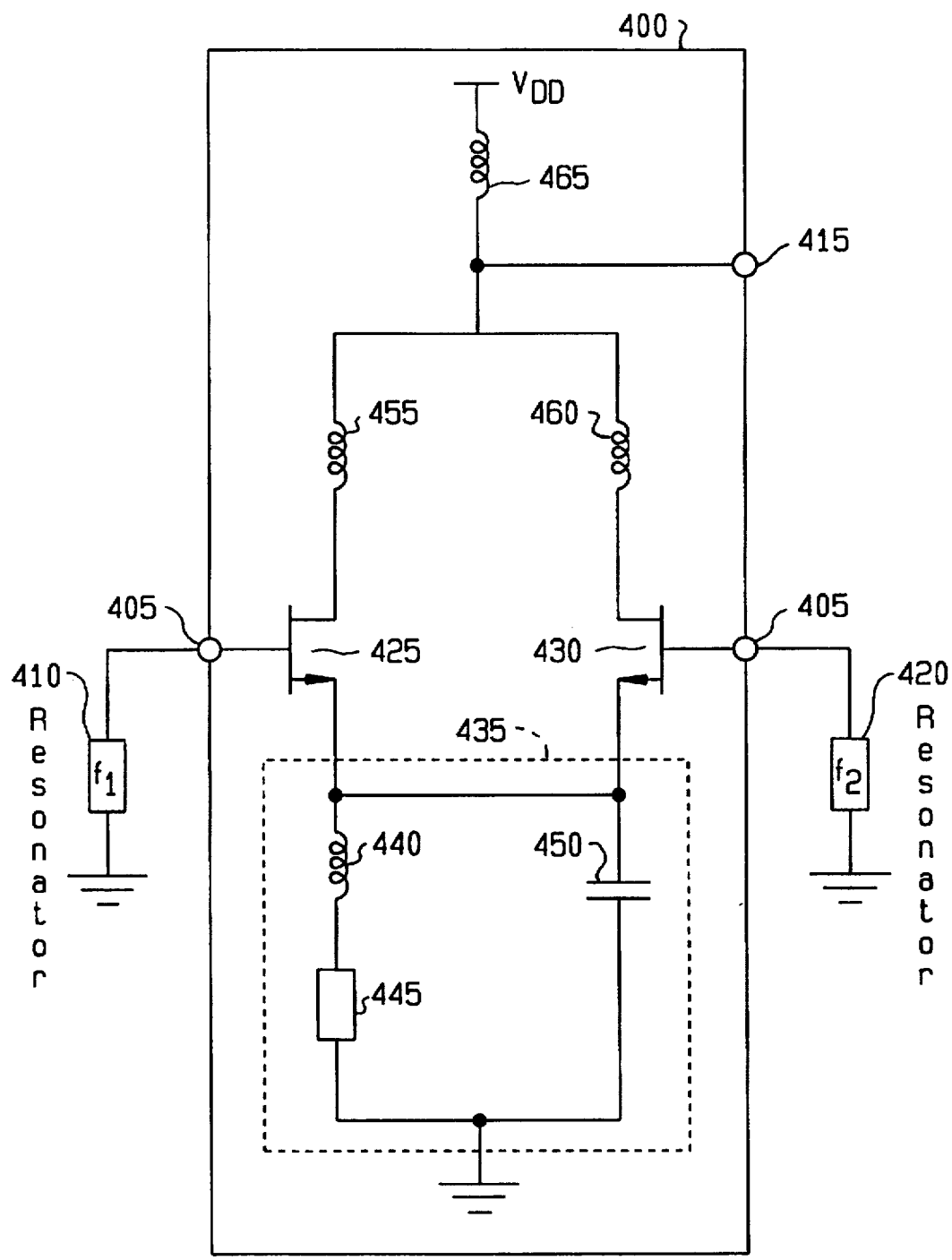
FIG. 4A is a schematic circuit diagram of a preferred embodiment of the first embodiment.

A preferred embodiment, illustrated in FIG. 4A, provides a local oscillator 400 in the form of a GaAs monolithic integrated circuit (IC) and it includes two depletion mode GaAs Field Effect Transistors ("FETs") 425 and 430.

The gate terminal of FET 425 is connected via an input port 405 to an external dielectric resonator 410 having a resonant frequency of 9.75 GHz. The gate terminal of FET 430 is connected to another external dielectric resonator 420 having a resonant frequency of 10.6 GHz.

The source terminals of FETs 425 and 430 are connected together and are coupled to the ground through a common source impedance circuit 435 including inductor 440, capacitor 450 and resistor 445. The drain terminal of FET 425 is coupled to a DC supply $V_{DD}$ through inductors 455 and 465. The drain terminal of FET 460 is connected to $V_{DD}$ through inductors 460 and 465. The output LO signal is provided at an LO output port 415.

The LO operates as follows: To provide an LO signal at 9.75 GHz, a negative DC potential sufficiently large to turn FET 430 off is applied to the gate of FET 430 while the ground or a positive potential is applied to FET 425 so as to turn it on. (In the context of the present invention and also well known to those skilled in the art, a FET is "turned on" when it is substantially conducting across the source and drain terminals of the FET, and it is deemed to be "turned off" when it displays substantial resistance between its source and drain terminals). Because FET 430 is turned off, it will not operate with resonator 420 to generate a 10.6 GHz signal. FET 425 is turned on and it operates in conjunction with resonator 410 to provide a 9.75 GHz LO signal at output port 415.

To obtain an output LO signal at 10.6 GHz, a negative DC voltage is applied to the gate terminal of FET 425 such that FET 425 is turned off and the ground or a positive potential is applied to FET 430 to turn it on. A 10.6 GHz LO signal is thus obtained at LO output port 415.

Figure 4B:
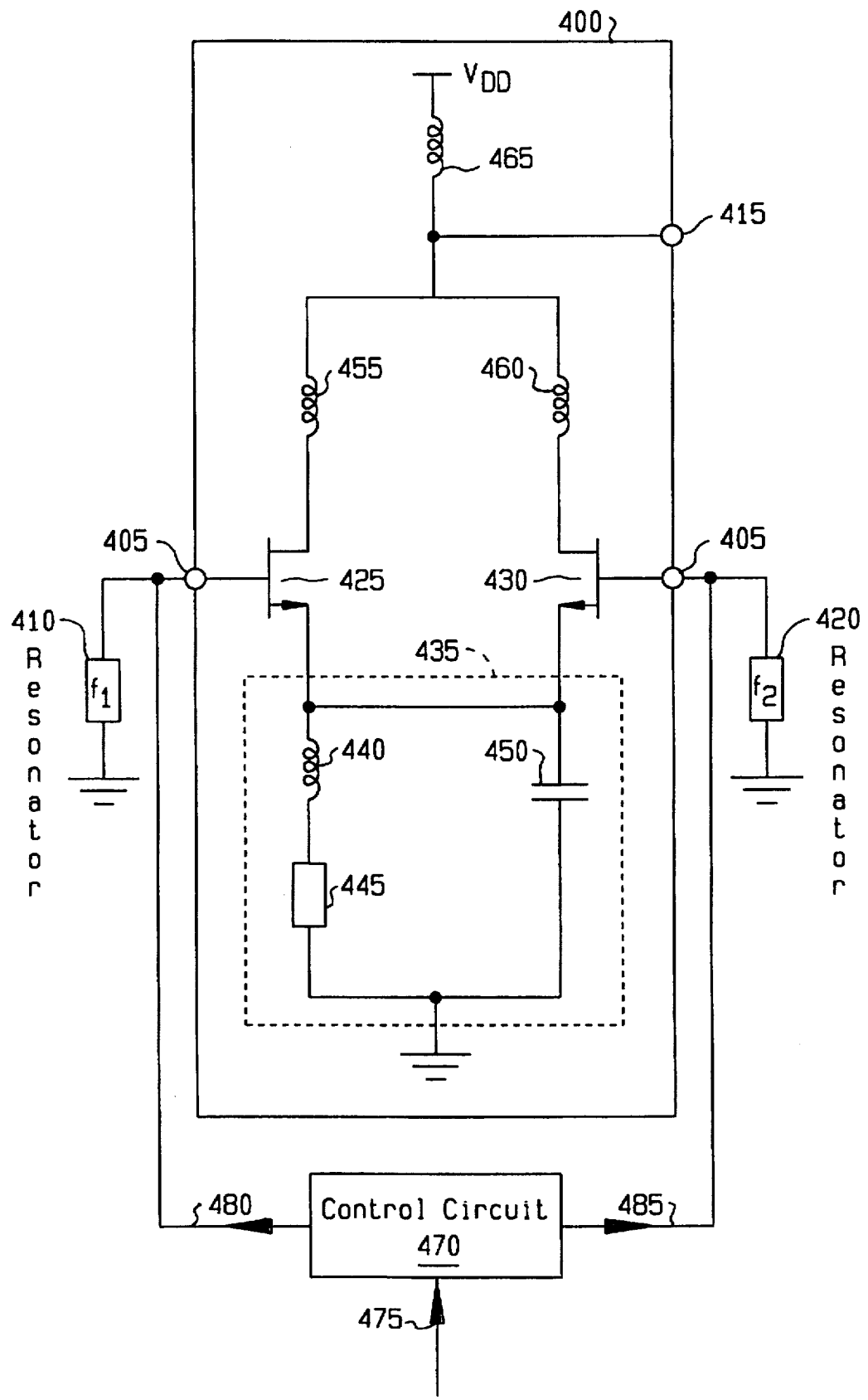
FIG. 4B shows the schematic circuit diagram of an alternative embodiment to the circuit of FIG. 4A.

In this multi-frequency local oscillator, the DC voltages applied to the gate terminals of FETs 425 and 430 may be generated and provided by any suitable circuit. One way to provide the DC voltages, as illustrated in FIG. 4B, is to utilize a control circuit 470 which receives a control signal 475 and provides DC signals 480 and 485 to the gate terminals of FETs 425 and 430, respectively. In DBS or CATV systems, the control signal may be, for example, a signal for changing the TV channel.

It will be apparent to those skilled in the art that other means or circuits may be used to provide voltages to the gates of the FETs as long as desired voltages are provided to the FETs. The operation of the multi-frequency local oscillator of the present invention does not require any specific type of circuits to provide the gate control voltages.

It should be noted that the above-described preferred embodiment uses depletion mode GaAs FETs as an example. As it is known to those skilled in the art, other types of transistors such as enhancement mode GaAs FETs, bipolar transistors, or silicon MOS transistors may also be used in the LO in place of the GaAs FETs; they are all within the scope of the present invention.

It should also be noted that, although dielectric resonators are used in the preferred embodiment, it is by no means a limitation to the present invention. As known to one skilled in the art, other types of resonators such as varactor diodes and any other circuits that provides oscillation signals at desired LO frequencies may be used in place of the dielectric resonators used in the preferred embodiment; they are also within the scope of the present invention.

Figure 5:
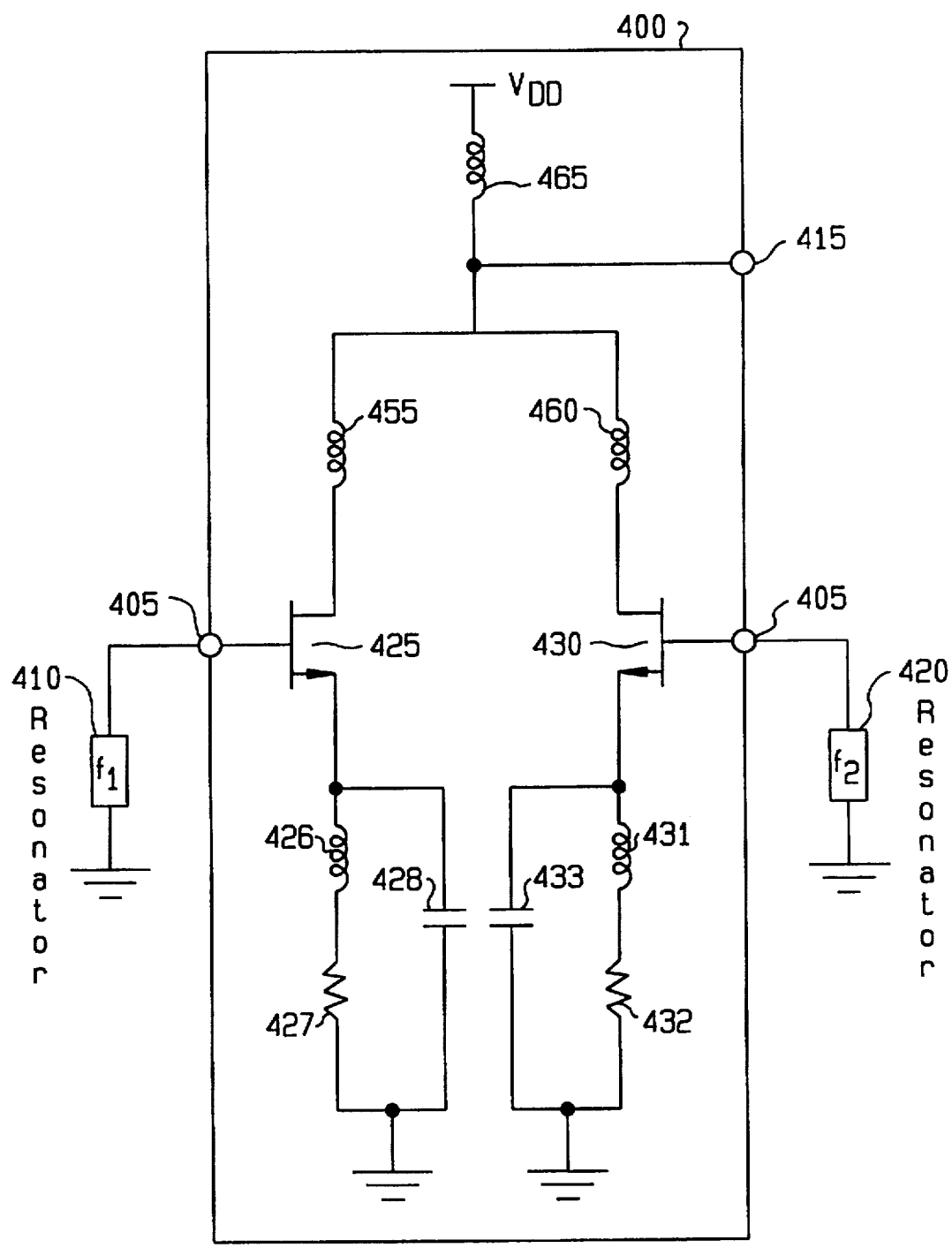
FIG. 5 illustrates another preferred embodiment of the first embodiment.

The above-described preferred embodiment includes two GaAs FETs sharing a common source impedance load. Alternatively, each FET can have its own source load. As depicted in FIG. 5, the source load of FET 425 is a circuit including inductor 426, resistor 427 and capacitor 428, 30 whereas the source load of transistor 430 includes inductor 431, resistor 432 and capacitor 433. This local oscillator offers the advantage that the source load for each FET can be chosen independently from the source load of the other FET, thus offering more design freedom.

In the above-described preferred LO, the GaAs FETs are coupled to the external resonators at their gate terminals. Alternatively, the external resonators can also be coupled to the source terminals of the GaAs FETs, respectively, to generate LO signals.

Figure 6:
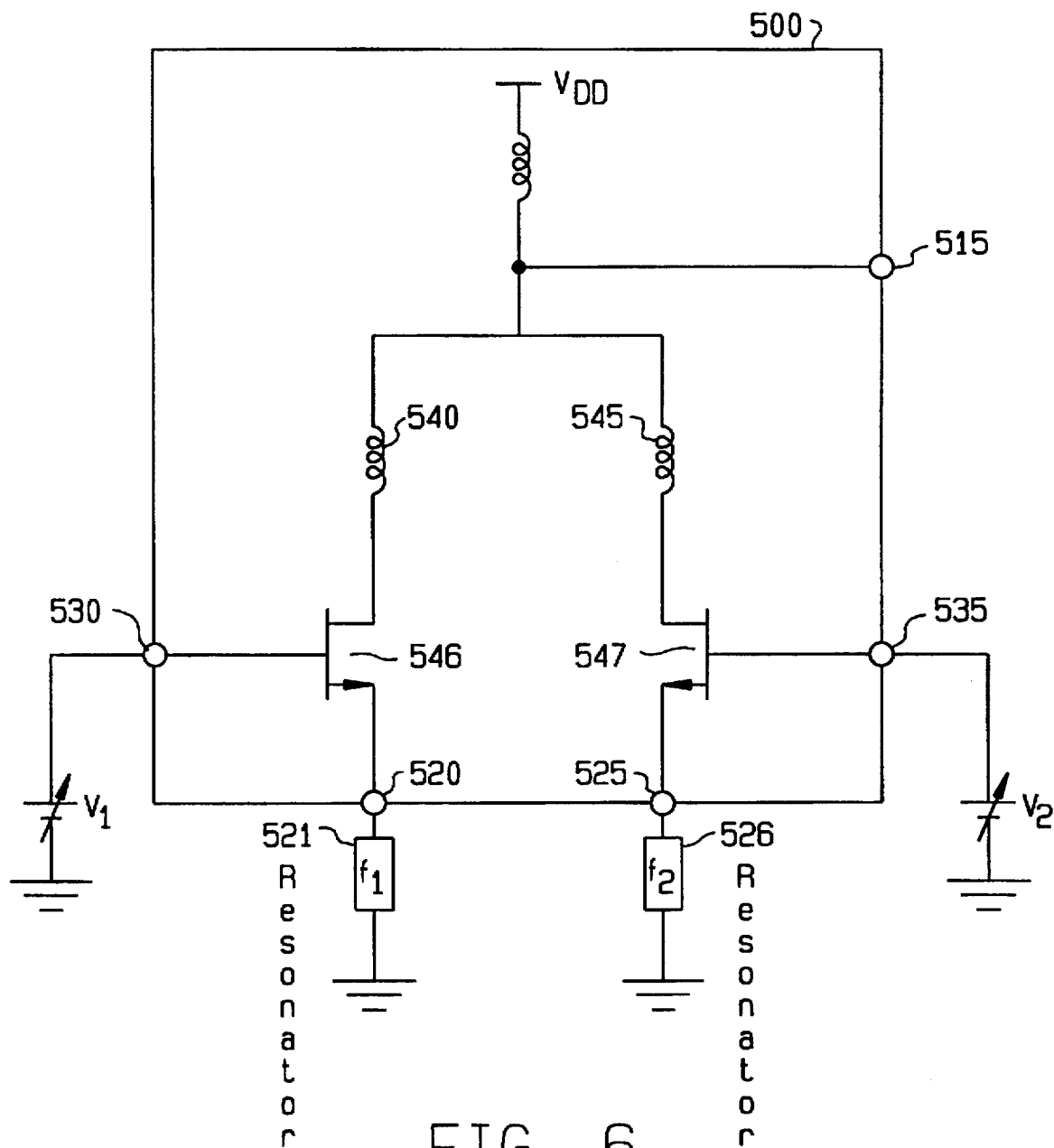
FIG. 6 depicts another alternative embodiment of the present invention.

Illustrated in FIG. 6, an LO 500 comprises two depletion mode GaAs FETs 546 and 547, the source terminals of which are coupled to external resonators 521 and 526, respectively, through input ports 520 and 525. The two FETs are turned on or off by control voltages $V_1$ and $V_2$ applied to their gates, respectively, through ports 530 and 535. The LO provides an output LO signal at an LO output port 515. The output LO signal frequency is selected by turning on the FET that is coupled to the resonator having the desired resonant frequency while keeping the other FET turned off.

Figure 7:
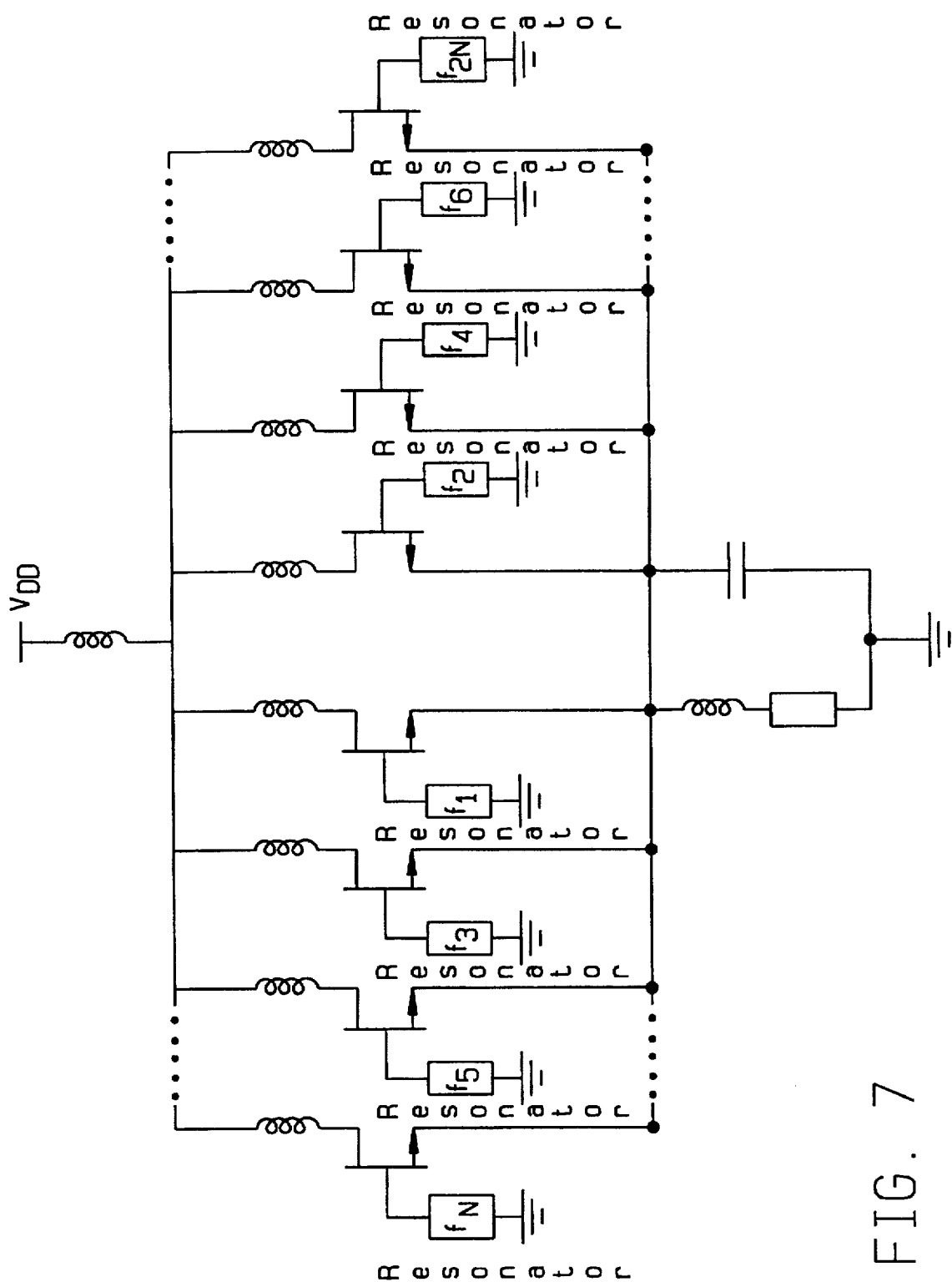
FIG. 7 is a schematic circuit diagram of another embodiment.

A major advantage of the LO of the present invention is that they can be easily made to provide LO signals at any desired number of frequencies. As depicted in FIG. 7, an LO for providing a signal at one of 2N frequencies is obtained by parallel connecting 2N FETs, each having its gate terminal connected to a resonator having a particular resonant frequency. In GaAs circuit layout, a large GaAs FET (i.e., a GaAs FET having a large ratio of gate-width to gate-length) which is the kind normally used in an LO, is usually formed by connecting, the drains, sources and gates, respectively, of a number of parallel located small FETs. Using simple design modification such as breaking the connecting gates of the small FETs, the number of external resonators coupled to the LO can be easily altered.

Figure 8:
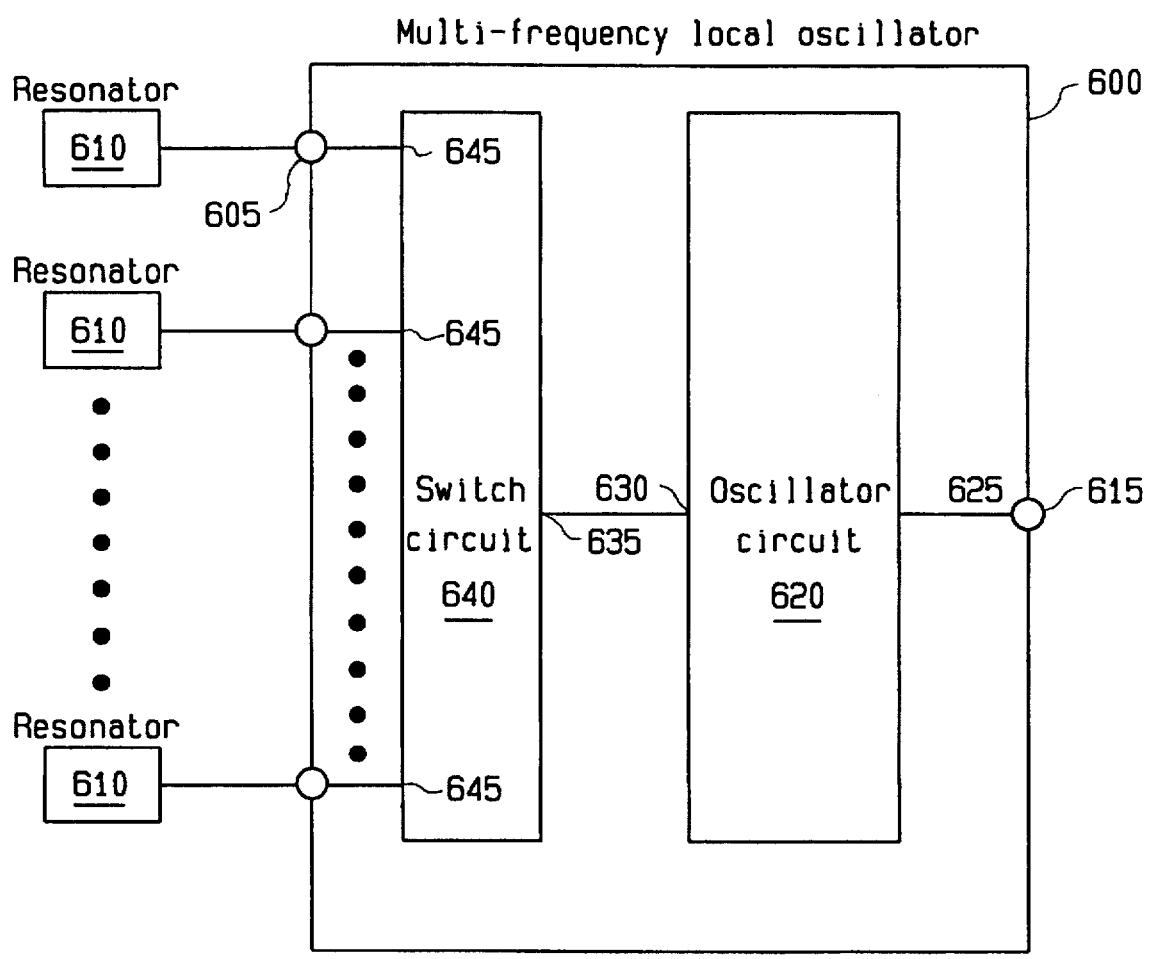
FIG. 8 illustrates a second embodiment of the present invention.

A second embodiment of the present invention, illustrated in FIG. 8, provides a multiple-frequency local oscillator 600 which includes an oscillator circuit 620 and a switch circuit 640. Oscillator circuit 620 has an input node 630 connected to an output node 635 of the switch circuit and an output node 625 connected to an LO output port 615. Switch circuit 640 has a number of input terminals 645 coupled to a number of LO input ports 605 for coupling to a number of resonators 610, respectively.

When operating, the switch circuit is controlled to selectively couple only one of the resonators to the oscillator circuit while decoupling the other resonators from the oscillator circuit. Consequently, at the LO output port, an LO output signal at the resonant frequency of the selected resonator is provided. By selecting the desired resonator to couple to the oscillator circuit, the local oscillator can provide an LO signal at any one of the resonant frequencies of the resonators.

Figure 9:
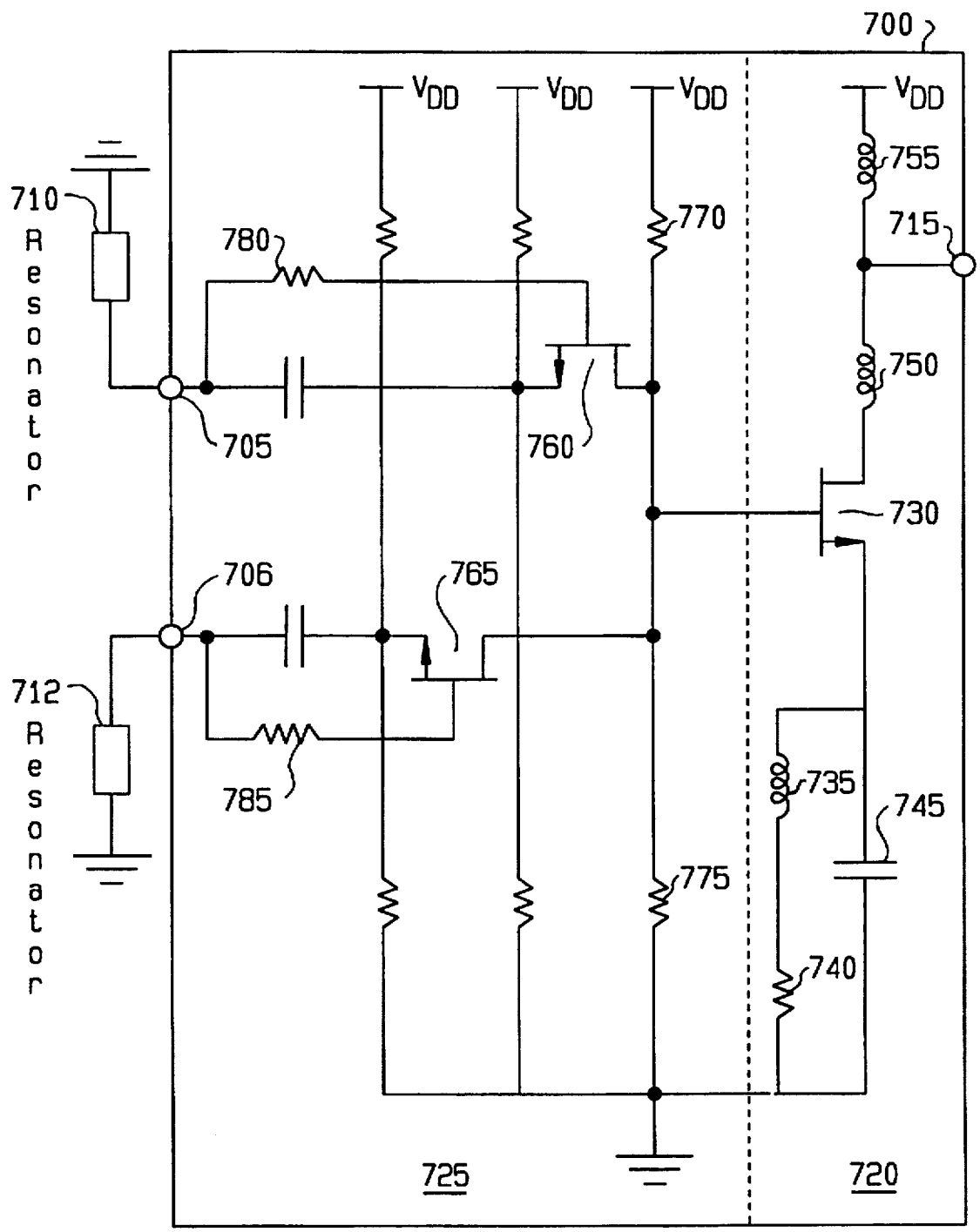
FIG. 9 shows the schematic circuit diagram of a preferred embodiment.

Referring to FIG. 9, in a preferred embodiment, a local oscillator 700 is in the form of a GaAs monolithic IC having two functional blocks, an oscillator circuit portion 720 and a switch portion 725. Oscillator portion 720 includes a GaAs depletion mode FET 730 having its source terminal coupled to the ground potential via a circuit including inductor 735, resistor 740 and capacitor 745, and its drain terminal coupled to a DC power supply $V_{DD}$ via two inductors 750 and 755. The intersection between inductors 750 and 755 is connected to an LO output port 715.

Switch circuit portion 725 includes two additional depletion mode GaAs FETs 760 and 765. The source terminals of FETs 760 and 765 are capacitively coupled to two dielectric resonators 710 and 712, respectively, via LO input ports 705 and 706. The drain terminals of the FETs are connected to the gate terminal of FET 730 and are DC biased by the DC power supply $V_{DD}$ via two resistors 770 and 775. The gate terminals of FETs 760 and 765 are connected to LO input ports 705 and 706 through resistors 780 and 785, respectively.

This local oscillator operates as follows: Suppose dielectric resonators 710 and 712 have resonant frequencies of 9.75 GHz and 10.6 GHz, respectively. When a negative potential is applied to the gate of FET 765 through port 706, FET 765 is turned off and resonator 712 is decoupled from oscillator circuit portion 720. By applying the ground or a positive potential to the gate of FET 760 to turn it on, the 9.75 GHz resonator 710 is thus coupled to the gate of FET 730 through FET 760. The oscillation circuit portion operates in conjunction with resonator 710 to provide a 9.75 GHz signal at the LO output port.

Alternatively, by applying appropriate potentials to the gate terminals of FET 760 and 765 such that FET 760 is turned off and FET 765 is turned on, an LO output signal at a frequency of 10.6 GHz results. The potentials to the gates may be applied from the resonators. As in the case of the first embodiment, a control circuit or other type of circuits may be used to provide the potentials to the gate terminals of FETs 760 and 765.

In accordance with the present invention, a frequency conversion device including a multi-frequency local oscillator is provided. The frequency conversion device comprises a mixer circuit coupled to a multiple-frequency local oscillator for receiving an LO signal at one of a number of predetermined LO frequencies. The mixer circuit receives an input RF signal and combines it with the LO signal to generate an output IF signal.

Figure 10:
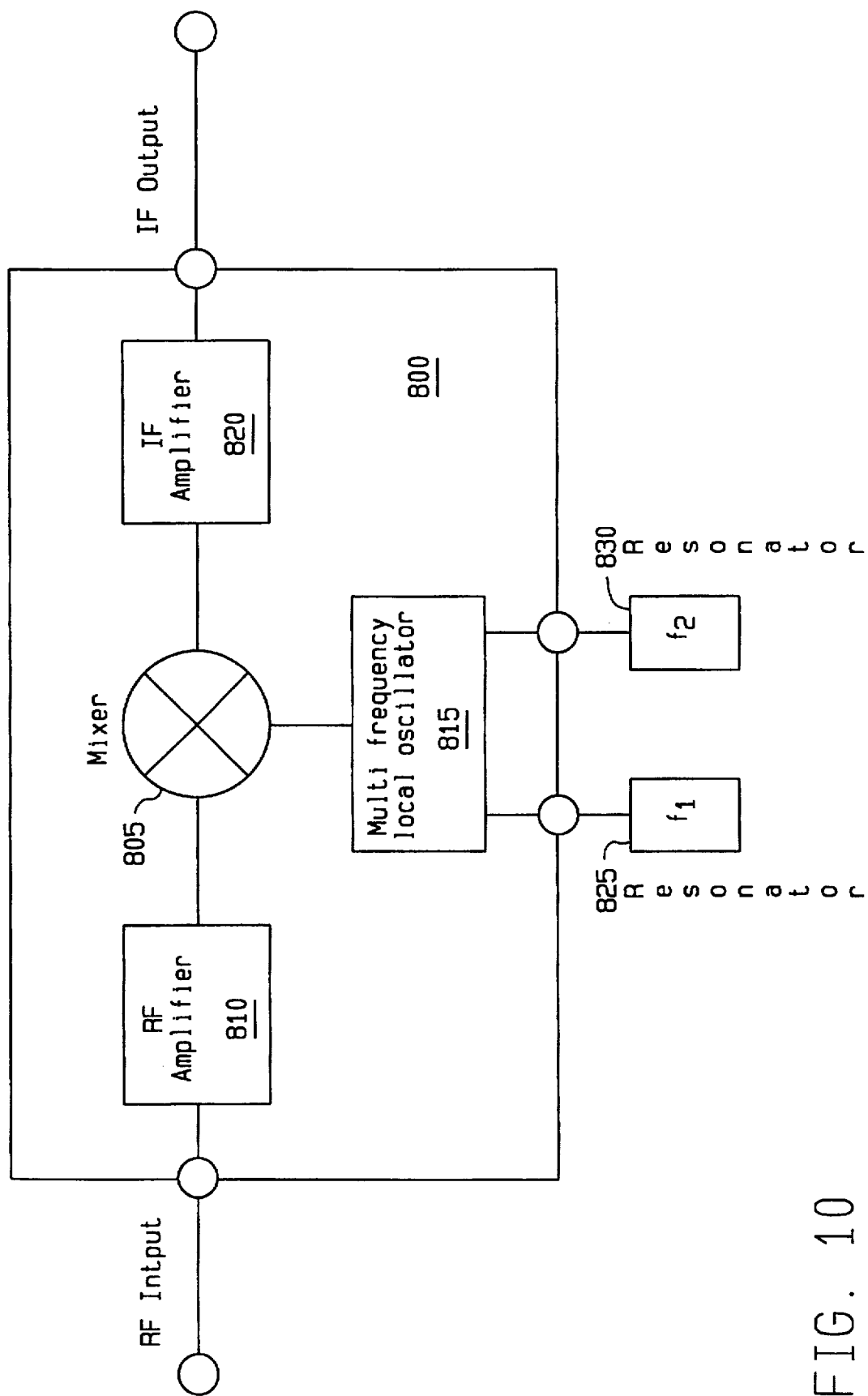
FIG. 10 depicts a preferred embodiment of a frequency conversion device of the present invention.

Referring to FIG. 10, in a preferred embodiment, a frequency conversion device 800 is in the form of a GaAs monolithic IC and it includes a mixer circuit 805 coupled to an RF amplifier 810, an IF amplifier 820 and a multiple-frequency local oscillator 815. Multi-frequency local oscillator 815 is coupled at its two LO input ports to two external dielectric resonators 825 and 830 having resonant frequencies of 9.75 GHz and 10.6 GHz, respectively. The local oscillator is controlled to selectively provide an LO signal to the mixer at either of those two frequencies. In operation, the mixer circuit receives an RF signal from the RF amplifier and an LO signal from the multiple-frequency local oscillator and provides an IF signal to the IF amplifier. The input RF signal is provided to the RF amplifier from, for example, a satellite antenna or an optical cable.

In this device, because the multiple-frequency local oscillator can provides an LO signal at one of a multiple of frequencies such as at either 9.75 GHz or 10.6 GHz, the device is able to convert an input RF signal covering both frequency bands 10.7–11.7 GHz and the 11.7–12.75 GHz, and provides an output RF signal at a frequency between 950–1950 MHz or 1100–2150 MHz. The input RF frequency range is thus greatly improved as compared with currently available single downconverter systems.

Figure 11:
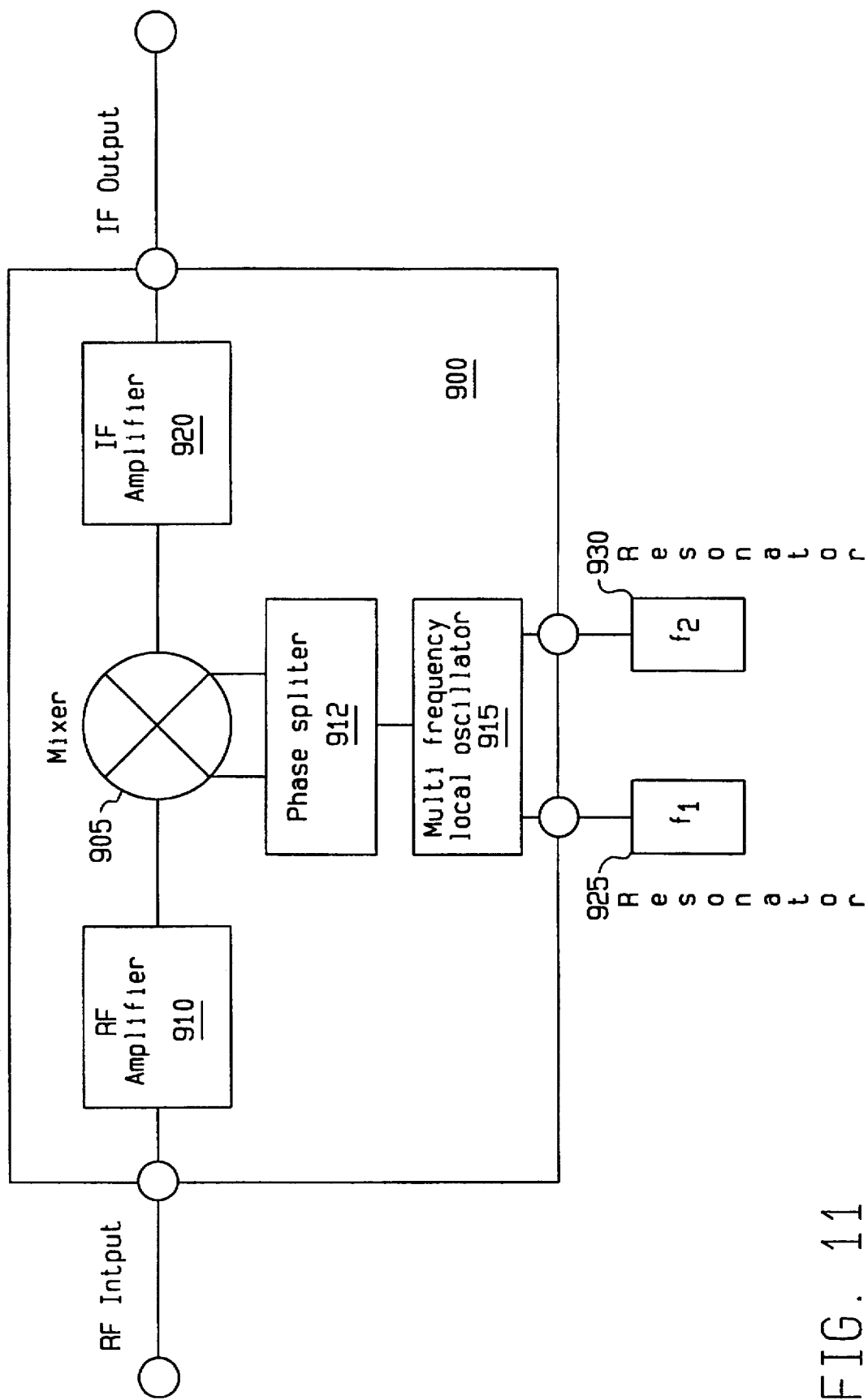
FIG. 11 illustrates another preferred embodiment of a frequency conversion device of the present invention.

In an alternative embodiment depicted in FIG. 11, the frequency conversion further includes, in addition to a mixer circuit 905, RF and IF amplifiers 910 and 920, and a multi-frequency local oscillator 915, a phase splitter circuit 912. Located between the mixer circuit and the LO, the phase splitter circuit receives the output LO signal from the LO and converts it into two LO signals having opposite phase but the same frequency before providing them to the mixer circuit. In this embodiment, mixer circuit 905 is designed to operate with the two opposed phased LO signals; the RF and If amplifiers re differential amplifiers.

As it will be apparent to those skilled in the art, numerous modifications may be made within the scope of the present invention, which is not intended to be limited except in accordance with the following claims.

What is claimed is:

1. A multiple-frequency local oscillator having a plurality of LO input ports for coupling to a plurality of resonators, respectively, each of said plurality of resonators having a predetermined resonant frequency, said local oscillator operating to provide at an LO output port an output LO signal at any one of said resonant frequencies, said local oscillator comprising:

a plurality of oscillator circuit means having input terminals connected to said LO input ports for coupling to said resonators, respectively, and output terminals connected together to said LO output port, each oscillator circuit means being capable of operating with the resonator coupled thereto to provide an LO signal at the resonator's resonant frequency, said plurality of oscillator circuit means comprising two field effect transistors (FETs), the gate terminals of the two FETs being coupled to two resonators, respectively, the source terminals of the FETs being connected together and coupled to the ground potential via a source impedance load, the drain terminals of the FETs being connected and coupled to a DC power supply via two drain impedance loads, respectively, and a commonly shared impedance load; and means for controlling said plurality of oscillator circuit means such that only one of said oscillator circuit means is selected to operate while the other oscillator circuit means is prevented from operation, whereby said output LO signal is at the frequency that is the resonant frequency of the resonator that is coupled to said selected oscillator means.

2. The local oscillator of claim 1 wherein said two FETs are depletion mode FETs, and said means for controlling said plurality of oscillator circuit means comprises means for applying a ground or a positive potential to the gate of one of said FETs to turn it on and applying a negative potential to the gate of the other FET to turn it off.

3. The local oscillator of claim 1 wherein one of said resonators has a resonant frequency of approximately 9.75 GHz and the other resonator has a resonant frequency of approximately 10.6 GHz.

4. A multiple-frequency local oscillator having a plurality of LO input ports for coupling to a plurality of resonators, respectively, each of said plurality of resonators having a predetermined resonant frequency, said local oscillator operating to provide at an LO output port an output LO signal at any one of said resonant frequencies, said local oscillator comprising:

a plurality of oscillator circuit means having input terminals connected to said LO input ports for coupling to said resonators, respectively, and output terminals connected together to said LO output port, each oscillator circuit means being capable of operating with the resonator coupled thereto to provide an LO signal at the resonator's resonant frequency, said plurality of oscillator circuit means comprising two field effect transistors (FETs), the gate terminals of the two FETs being coupled to two resonators, respectively, the source terminals of the FETs being coupled to the ground potential via two source impedance loads, respectively, the drain terminals of the FETs being connected to a DC power supply via two drain impedance loads, respectively, and a commonly shared impedance load; and means for controlling said plurality of oscillator circuit means such that only one of said oscillator circuit means is selected to operate while the other oscillator circuit means is prevented from operation, whereby said output LO signal is at the frequency that is the resonant frequency of the resonator that is coupled to said selected oscillator means.

5. The local oscillator of claim 4 wherein said two FETs are depletion mode FETs, and said means for controlling said plurality of oscillator circuit means comprises means for applying a ground or a positive potential to one of said FETs to turn it on and applying a negative potential to the other FET to turn it off.

6. The local oscillator of claim 4 wherein one of said resonators has a resonant frequency of approximately 9.75 GHz and the other resonator has a resonant frequency of approximately 10.6 GHz.

7. A frequency conversion device for converting an input RF signal into an output IF signal comprising:

a multiple-frequency local oscillator having a plurality of LO input ports for coupling to a plurality of resonators, respectively, each of said plurality of resonators having a predetermined resonant frequency, said local oscillator operating to provide at an LO output port an output LO signal at any one of said resonant frequencies.

said multiple-frequency local oscillator comprising a plurality of oscillator circuit means having input terminals connected to said LO input ports for coupling to said resonators, respectively, and output terminals connected together to said LO output port, each oscillator circuit means being capable of operating with the resonator coupled thereto to provide an LO output signal at the resonator's resonant frequency, and means for controlling said plurality of oscillator circuit means such that only one of said oscillator circuit means is selected to operate while the other oscillator circuit means are prevented from operation, whereby said local oscillator provides an output LO signal at the frequency that is the resonant frequency of the resonator that is coupled to said selected oscillator means, said plurality of oscillator circuit means comprising two field effect transistors (FETs), the gate terminals of the two FETs being coupled to two resonators, respectively, the source terminals of the FETs being connected together and coupled to the ground potential via a source impedance load, the drain terminals of the FETs being connected and coupled to a DC power supply via two drain impedance loads, respectively, and a commonly shared impedance load; and a mixer circuit for receiving an RF signal and said output LO signal from said local oscillator and for generating an IF signal by mixing said RF and LO signals.

8. The frequency conversion device of claim 7 wherein said two FETs are depletion mode FETs, and said means for controlling said plurality of oscillator circuit means comprises means for applying a ground or a positive potential to one of said FETs so as to turn it on and applying a negative potential to the other FET to turn it off.

9. The frequency conversion device of claim 7 wherein one of said resonators has a resonant frequency of approximately 9.75 GHz and the other resonator provides a signal at a frequency of approximately 10.6 GHz.

10. A frequency conversion device for converting an input RF signal into an output IF signal comprising:

a multiple-frequency local oscillator having a plurality of LO input ports for coupling to a plurality of resonators, respectively, each of said plurality of resonators having a predetermined resonant frequency, said local oscillator operating to provide at an LO output port an output LO signal at any one of said resonant frequencies, said local oscillator comprising a plurality of oscillator circuit means having input terminals connected to said LO input ports for coupling to said resonators, respectively, and output terminals connected together to said LO output port, each oscillator circuit means being capable of operating with the resonator coupled thereto to provide an LO signal at the resonator's resonant frequency, said plurality of oscillator circuit means comprising two field effect transistors (FETs), the gate terminals of the two FETs being coupled to two resonators, respectively, the source terminals of the FETs being coupled to the ground potential via two independent source impedance loads, respectively, the drain terminals of the FETs being connected to a DC power supply via two drain impedance loads, respectively, and a commonly shared impedance load; and a mixer circuit for receiving an RF signal and said output LO signal from said local oscillator and for generating an IF signal by mixing said RF and LO signals.

11. The frequency conversion device of claim 10 wherein said two FETs are depletion mode FETs, and said means for controlling said plurality of oscillator circuit mean comprises means for applying a ground or a positive potential to one of said FETs thereby turning it on and applying a negative potential to the other FET thereby turning it off.

12. The frequency conversion device of claim 10 wherein one of said resonators has a resonant frequency of approximately 9.75 GHz and the other resonator has a frequency of approximately 10.6 GHz.

13. A multiple-frequency local oscillator having a plurality of LO input ports for coupling to a plurality of resonators, respectively, and an LO output port, each of such plurality of resonators having a resonant frequency, said local oscillator operating to provide at the LO output port an LO output signal at any one of such resonant frequencies, said local oscillator comprising:

a plurality of field effect transistors (FETs) coupled via their gate terminals to respective LO input ports for coupling to respective resonators, the source terminals of the FETs being connected together and coupled to a low reference potential via a common source impedance load, the drain terminals of the FETs being connected together to the LO output port and being coupled to a DC power supply via a common drain impedance load; and means for controlling said plurality of FETs such that only one of said FETs is selectively turned on while the others are turned off, whereby such LO output signal is at the resonant frequency of the resonator coupled to said selected FET.

14. The local oscillator of claim 13 implemented as a semiconductor integrated circuit or a portion thereof.

15. The local oscillator of claim 13 implemented as a GaAs integrated circuit or a portion thereof.

16. The local oscillator of claim 13 wherein said FETs are depletion mode FETs, and said means for controlling said plurality of FETs comprises means for applying a zero or positive voltage between the gate and source of said selected FET to turn it on and applying a negative voltage between the gate and source of the other FETs to turn them off.

17. The local oscillator of claim 13 comprising two FETs for coupling to two resonators having respective resonant frequencies of approximately 9.75 GHz and 10.6 GHz.

18. A frequency conversion device for converting an RF input signal to an IF output signal comprising:

a multiple-frequency local oscillator having a plurality of LO input ports for coupling to a plurality of resonators, respectively, and an LO output port, each of such plurality of resonators having a resonant frequency, said local oscillator operating to provide at the LO output port an LO output signal at any one of such resonant frequencies, said local oscillator comprising a plurality of field effect transistors (FETs) coupled via their gate terminals to respective LO input ports for coupling to respective resonators, the source terminals of the FETs being connected together and coupled to a low reference potential via a common source impedance load, the drain terminals of the FETs being connected together to the LO output port and being coupled to a DC power supply via a common drain impedance load, and means for controlling said plurality of FETs such that only one of said FETs is selectively turned on while the others are turned off, whereby such LO output signal is at the resonant frequency of the resonator coupled to said selected FET; and a mixer circuit for receiving such RF input signal and such LO output signal from said local oscillator and generating such IF signal by mixing such signals.

19. The frequency conversion device of claim 18 implemented as a semiconductor integrated circuit.

20. The frequency conversion device of claim 19 implemented as a GaAs integrated circuit.

21. The frequency conversion device of claim 18 wherein said FETs are depletion mode FETs, and said means for controlling said plurality of FETs comprises means for applying a zero or positive voltage between the gate and source of said selected FET to turn it on and applying a negative voltage between the gate and source of the other FETs to turn them off.

22. The frequency conversion device of claim 18 comprising two FETs for coupling to two resonators having respective resonant frequencies of approximately 9.75 GHz and 10.6 GHz.

23. A multiple-frequency local oscillator having a plurality of LO input ports for coupling to a plurality of resonators, respectively, and an LO output port, each of such plurality of resonators having a resonant frequency, said local oscillator operating to provide at the LO output port an LO output signal at any one of such resonant frequencies, said local oscillator comprising:

a plurality of field effect transistors (FETs) coupled via their gate terminals to respective LO input ports for coupling to respective resonators, each FET source terminal being coupled to a low reference potential via a source impedance load, the drain terminals of the FETs being connected together and coupled to a DC power supply via a common drain impedance load; and means for controlling said plurality of FETs such that only one of said FETs is selectively turned on while the other FETs are turned off, whereby such output LO signal is at the resonant frequency of the resonator coupled to said selected FET.

24. The local oscillator of claim 23 implemented as a semiconductor integrated circuit or a portion thereof.

25. The local oscillator of claim 23 implemented as a GaAs integrated circuit or a portion thereof.

26. The local oscillator of claim 23 wherein said FETs are depletion mode FETs, and said means for controlling said plurality of FETs comprises means for applying a zero or positive voltage between the gate and source of said selected FET to turn it on and applying a negative voltage between the gate and source of the others to turn them off.

27. The local oscillator of claim 23 comprising two FETs for coupling to two resonators having respective resonant frequencies of approximately 9.75 GHz and 10.6 GHz.

28. A frequency conversion device for converting an RF input signal to an IF output signal comprising:

a multiple-frequency local oscillator having a plurality of LO input ports for coupling to a plurality of resonators, respectively, and an LO output port, each of such plurality of resonators having a resonant frequency, said local oscillator operating to provide at the LO output port an LO output signal at any one of such resonant frequencies, said local oscillator comprising a plurality of field effect transistors (FETs) coupled via their gate terminals to respective LO input ports for coupling to respective resonators, each FET source terminal being coupled to a low reference potential via a source impedance load, the drain terminals of the FETs being connected together and coupled to a DC power supply via a common drain impedance load, and means for controlling said plurality of FETs such that only one of said FETs is selectively turned on while the other FETs are turned off, whereby such output LO signal is at the resonant frequency of the resonator coupled to said selected FET; and a mixer circuit for receiving such RF input signal and such LO output signal from said local oscillator and generating such IF output signal by mixing such RF and LO signals.

29. The frequency conversion device of claim 28 implemented as a semiconductor integrated circuit.

30. The frequency conversion device of claim 29 implemented as a GaAs integrated circuit.

31. The frequency conversion device of claim 28 wherein said FETs are depletion mode FETs, and said means for controlling said plurality of FETs comprises means for applying a zero or positive voltage between the gate and source of said selected FET to turn it on and applying a negative voltage between the gate and source of the others to turn them off.

32. The frequency conversion device of claim 28 comprising two FETs for coupling to two resonators having respective resonant frequencies of approximately 9.75 GHz and 10.6 GHz.

33. A multiple-frequency local oscillator having a plurality of LO input ports for coupling to a plurality of resonators, respectively, and an LO output port, each of such plurality of resonators having a resonant frequency, said local oscillator operating to provide at the LO output port an LO output signal at any one of such resonant frequencies, said local oscillator comprising:

a plurality of field effect transistors (FETs) coupled via their source terminals to respective LO input ports for coupling to respective resonators, the drain terminals of the FETs being connected together to the LO output port and being coupled to a DC Power supply via a common drain impedance load; and means for controlling said plurality of FETs such that only one of said FETs is selectively turned on while the others are turned off, whereby such LO output signal is at the resonant frequency of the resonator coupled to said selected FET.

34. The local oscillator of claim 33 implemented as a semiconductor integrated circuit or a portion thereof.

35. The local oscillator of claim 34 implemented as a GaAs integrated circuit or a portion thereof.

36. The local oscillator of claim 33 wherein said FETs are depletion mode FETs, and said means for controlling said plurality of FETs comprises means for applying a zero or positive voltage between the gate and source of said selected FET to turn it on and applying a negative voltage between the gate and source of the others to turn them off.

37. The local oscillator of claim 33 comprising two FETs for coupling to two resonators having respective resonant frequencies of approximately 9.75 GHz and 10.6 GHz.

38. A frequency conversion device for converting an RF input signal into an IF output signal comprising:

a multiple-frequency local oscillator having a plurality of LO input ports for coupling to a plurality of resonators, respectively, and an LO output port, each of such plurality of resonators having a resonant frequency, said local oscillator operating to provide at the LO output port an LO output signal at any one of such resonant frequencies, said local oscillator comprising a plurality of field effect transistors (FETs) coupled via their source terminals to respective LO input ports for coupling to respective resonators, the drain terminals of the FETs being connected together to the LO output port and being coupled to a DC Power supply via a common drain impedance load, and means for controlling said plurality of FETs such that only one of said FETs is selectively turned on while the others are turned off, whereby such LO output signal is at the resonant frequency of the resonator coupled to said selected FET; and a mixer circuit for receiving such RF input signal and such LO output signal from said local oscillator and generating such IF output signal by mixing such RF and LO signals.

39. The frequency conversion device of claim 38 implemented as a semiconductor integrated circuit.

40. The frequency conversion device of claim 39 implemented as a GaAs integrated circuit.

41. The frequency conversion device of claim 38 wherein said FETs are depletion mode FETs, and said means for controlling said plurality of FETs comprises means for applying a zero or positive voltage between the gate and source of said selected FET to turn it on and applying a negative voltage between the gate and source of the others to turn them off.

42. The frequency conversion device of claim 38 comprising two FETs for coupling to two resonators having respective resonant frequencies of approximately 9.75 GHz and 10.6 GHz.

* * * * *